United States Patent
Wang et al.

(10) Patent No.: US 7,476,954 B2
(45) Date of Patent: Jan. 13, 2009

(54) TMR DEVICE WITH HF BASED SEED LAYER

(75) Inventors: Hui-Chuan Wang, Pleasanton, CA (US); Kunliang Zhang, Milpitas, CA (US); Tong Zhao, Fremont, CA (US); Min Li, Dublin, CA (US)

(73) Assignee: Headway Technologies, Inc., Milpitas, CA (US)

( * ) Notice: Subject to any disclaimer, the term of this patent is extended or adjusted under 35 U.S.C. 154(b) by 201 days.

(21) Appl. No.: 11/652,740

(22) Filed: Jan. 12, 2007

(65) Prior Publication Data
US 2008/0171223 A1 Jul. 17, 2008

(51) Int. Cl.
*H01L 29/82* (2006.01)

(52) U.S. Cl. ............... 257/421; 257/295; 257/E27.006; 365/158; 438/3

(58) Field of Classification Search .................. 257/421, 257/E27.006
See application file for complete search history.

(56) References Cited

U.S. PATENT DOCUMENTS

| | | | |
|---|---|---|---|
| 6,992,359 B2 * | 1/2006 | Nguyen et al. | ............... 257/421 |
| 7,063,904 B2 | 6/2006 | Ikarashi et al. | |
| 7,077,936 B2 | 7/2006 | Saito et al. | |
| 7,092,222 B2 | 8/2006 | Hasegawa et al. | |
| 7,123,453 B2 | 10/2006 | Hasegawa et al. | |

OTHER PUBLICATIONS

*Periodic table*, from Wikipedia, free encyclopedia, pp. 1-6, Methods for displaying the periodic table, found: http://en.wikipedia.org/wiki/Periodic_table, downloaded on Jan. 23, 2007.

* cited by examiner

*Primary Examiner*—Tu-Tu V Ho
(74) *Attorney, Agent, or Firm*—Saile Ackerman LLC; Stephen B. Ackerman

(57) ABSTRACT

A MTJ structure is disclosed in which the seed layer is made of a lower Ta layer, a middle Hf layer, and an upper NiFe or NiFeX layer where X is Co, Cr, or Cu. Optionally, Zr, Cr, HfZr, or HfCr may be employed as the middle layer and materials having FCC structures such as CoFe and Cu may be used as the upper layer. As a result, the overlying layers in a TMR sensor will be smoother and less pin dispersion is observed. The Hex/Hc ratio is increased relative to that for a MTJ having a conventional Ta/Ru seed layer configuration. The trilayer seed configuration is especially effective when an IrMn AFM layer is grown thereon and thereby reduces Hin between the overlying pinned layer and free layer. Ni content in the NiFe or NiFeX middle layer is above 30 atomic % and preferably >80 atomic %.

20 Claims, 2 Drawing Sheets

US 7,476,954 B2

TMR DEVICE WITH HF BASED SEED LAYER

FIELD OF THE INVENTION

The invention relates to a high performance Magnetic Tunneling Junction (MTJ) element and a method for making the same, and more particularly, to a seed layer for the MTJ element that has a smoother surface and results in less pin dispersion than with a conventional seed layer.

BACKGROUND OF THE INVENTION

A MTJ element in a magnetic device such as a read head may be based on a tunneling magneto-resistance (TMR) effect wherein a stack of layers has a configuration in which two ferromagnetic layers are separated by a thin non-magnetic dielectric layer. The bottom layer in the MTJ element is typically comprised of a seed layer such as NiFeCr or a Ta/NiCr composite which promotes a <111> lattice orientation in overlying layers. Generally, an antiferromagnetic (AFM) layer, ferromagnetic "pinned" layer, tunnel barrier layer, ferromagnetic "free layer", and a capping layer are successively formed on the seed layer to complete the MTJ stack. The pinned layer has a magnetic moment that is fixed in the "x" direction, for example, by exchange coupling with the adjacent AFM layer that is also magnetized in the "x" direction. The thin tunnel barrier layer above the pinned layer is usually comprised of a dielectric material such as AlOx or MgO and is so thin that a current through it can be established by quantum mechanical tunneling of conduction electrons. The free layer has a magnetic moment that is either parallel or anti-parallel to the magnetic moment in the pinned layer. The magnetic moment of the free layer may change in response to external magnetic fields and it is the relative orientation of the magnetic moments between the free and pinned layers that determines the tunneling current and therefore the resistance of the tunneling junction. When a sense current is passed through the MTJ stack in a direction perpendicular to the layers therein, a lower resistance is detected when the magnetization directions of the free and pinned layers are in a parallel state ("1" memory state) and a higher resistance is noted when they are in an anti-parallel state or "0" memory state.

In an MRAM device, the MTJ element is formed between a bottom electrode such as a first conductive line and a top electrode which is a second conductive line. In a read operation, the information stored in an MRAM cell is read by sensing the magnetic state (resistance level) of the MTJ element through a sense current flowing top to bottom through the cell in a current perpendicular to plane (CPP) configuration. During a write operation, information is written to the MRAM cell by changing the magnetic state in the free layer to an appropriate one by generating external magnetic fields as a result of applying bit line and word line currents in two crossing conductive lines, either above or below the MTJ element. In certain MRAM architectures, the top electrode or the bottom electrode participates in both read and write operations.

One indication of good device performance is a high magnetoresistive (TMR) ratio which is dR/R where R is the minimum resistance of the MTJ element and dR is the maximum change in resistance observed by changing the magnetic state of the free layer. In order to achieve desirable properties such as a specific junction resistance x area (RA) value, a high dR/R value, and a high breakdown voltage (Vb), it is necessary to have a smooth tunnel barrier layer that is promoted by a smooth and densely packed growth, such as a <111> texture for the AFM layer, pinned layer, and seed layer. Although a high RA value of about 10000 ohm-$\mu m^2$ is acceptable for a large area (A), RA should be relatively small (<1000 ohm-$\mu m^2$) for smaller areas. Otherwise, R would be too high to match the resistivity of the transistor which is connected to the MTJ. In addition to MRAM applications, an MTJ element with a thinner tunnel barrier layer to give a very low RA (<5 ohms-$\mu m^2$) may be employed in TMR sensor head applications. Other desirable magnetic properties for an MTJ are a small interlayer coupling field (Hin) between the pinned layer and free layer, and a strong exchange coupling field (Hex) between the AFM layer and pinned layer is important to maintain the pinned layer magnetization in a certain direction.

One concern with a conventional Ta/NiCr (or Ta/NiFeCr) composite seed layer is that the growth of NiCr on Ta is sensitive to the Ta surface condition and depends on whether the Ta is an α-phase or β-phase material and if the Ta is partially oxidized. An improved configuration in a composite seed layer is necessary to provide a more consistent growth for the upper portion of the seed layer. The improved seed layer should also result in smoother layers in the MTJ stack and thereby generate a TMR device with higher performance capability for advanced applications that require high dR/R, low RA values, and low pin dispersion.

During a routine search of the prior art, the following four related patents were found. In U.S. Pat. No. 7,123,453, a magnetoresistive element having an exchange coupling film comprised of a NiFeHf seed layer and an underlying layer made of at least one element selected from Cr, Rh, Ta, Hf, Nb, Zr, and Ti, or a Ni alloy of one of the aforementioned elements is disclosed. U.S. Pat. No. 7,092,222 describes the same underlying layer as above but a NiFeCr seed layer with a high Cr content is employed to improve the wettability of the seed layer surface. U.S. Pat. Nos. 7,077,936 and 7,063,904 also relate to an exchange coupling film wherein a seed layer has an underlying layer made of at least one element selected from Cr, Rh, Ta, Hf, Nb, Zr, and Ti. However, the prior art does not teach a specific composition for an underlying layer comprising more than one element or whether or not the underlayer is an alloy.

SUMMARY OF THE INVENTION

One objective of the present invention is to provide a seed layer that consistently enables a smoother growth in overlying layers in a MTJ element and leads to higher Hex and lower Hin values than realized with conventional seed layers.

A further objective of the present invention is to provide a seed layer in a MTJ element that decreases pin dispersion and provides a more stable magnetoresistive sensor.

According to the present invention, these objectives are achieved by first providing a substrate on which a MTJ element is to be formed. In a preferred embodiment, the substrate is a bottom shield in a TMR read head and a MTJ stack of layers having a bottom spin valve configuration is formed on the substrate by sequentially depositing a seed layer, AFM layer, synthetic anti-parallel (SyAP) pinned layer, tunnel barrier layer, free layer, and a cap layer in a sputter deposition system. A key feature is that the seed layer is preferably a composite comprised of a lower Ta layer, a middle Hf layer, and an upper NiFe layer in which the Ni content is at least 30 atomic % and preferably >80 atomic %. Optionally, Hf in the middle layer may be replaced by another metal or alloy such as Zr, HfZr, HfCr, or Cr. Moreover, a ternary alloy NiFeX where X is Cr, Co, Cu or the like, or face centered cubic (FCC)

materials such as CoFe or Cu may be used instead of NiFe as the upper layer in the composite seed layer.

The AFM layer is preferably IrMn but may also be MnPt or the like. In one embodiment, the SyAP pinned layer has a Ru coupling layer sandwiched between two CoFe layers. AlOx, MgO, or TiOx layer may be employed as the tunnel barrier layer. Above the tunnel barrier layer is a free layer made of a CoFe/NiFe layer, for example. The top layer in the MTJ stack is a capping layer that may be made of Ru, Ta, or a composite thereof. All of the layers in the MTJ stack are formed by sputtering or ion beam deposition (IBD). In one aspect, the metal in the tunnel barrier layer is deposited in a sputter deposition chamber and then oxidized in an oxidation chamber by a natural oxidation (NOX) or radical oxidation (ROX) method. A conventional patterning and etching sequence may then be followed to define the shape of the MTJ element. Subsequently, an insulation layer is deposited on either side of the MTJ and a top shield is formed on the insulation layer and top surface of the MTJ element.

In a second embodiment, the MTJ described in the first embodiment may be formed between a lower electrode and an upper electrode in a MRAM structure. All layers in the MTJ stack may have the same composition as in the first embodiment. However, the tunnel barrier layer is preferably thicker than in a TMR read head in order to adjust the RA to a higher value. Furthermore, the free layer may have a CoFe or NiFe composition instead of a composite CoFe/NiFe layer as in the first embodiment.

DETAILED DESCRIPTION OF THE INVENTION

The present invention is composite seed layer which imparts improved magnetic properties and performance to a magnetic tunneling junction (MTJ) in a magnetic device. The drawings are provided by way of example and are not intended to limit the scope of the invention. Although the drawings depict a bottom spin valve structure, the present invention also applies to a top spin valve structure or a dual spin valve configuration in an MTJ element as appreciated by those skilled in the art. Moreover, the present invention is not limited to the TMR configuration described in the exemplary embodiment but may be employed in MTJ elements for other applications such as MRAM devices and GMR sensors.

Figure 1:
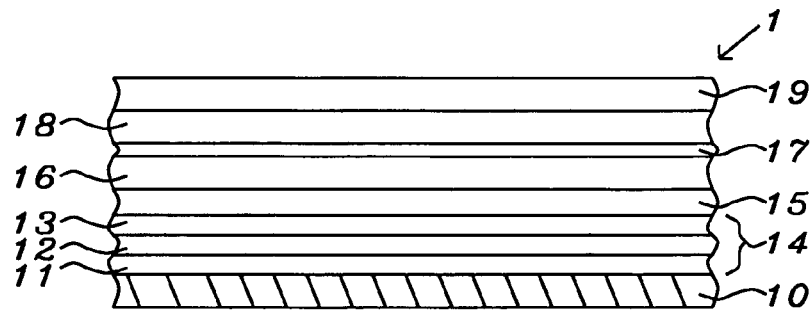
FIG. 1 is a cross-sectional view of a MTJ stack of layers having a composite seed layer according to one embodiment of the present invention.

A TMR read head formed according to a first embodiment of the present invention will now be described. Referring to FIG. 1, a partially completed magnetoresistive (MR) read head 1 also referred to as a TMR read head is shown in which an MTJ stack of layers is formed on a bottom shield (S1) 10 that may be a composite comprised of a lower NiFe layer and an upper α-TaN capping layer, for example. Typically, the bottom shield 10 is fabricated on a substrate (not shown) that is AlTiC or the like.

In one embodiment, the MTJ stack of layers is disposed on the bottom shield 10 by sequentially forming a composite seed layer 14, AFM layer 15, SyAP pinned layer 16, tunnel barrier layer 17, free layer 18, and a capping layer 19. A key feature is the composite seed layer 14 that is employed to promote growth of smooth and dense <111> crystal structure in the AFM layer 15 and SyAP pinned layer 16 that enables a larger Hex field between the aforementioned two layers which maintains a magnetic moment in the SyAP pinned layer in a direction determined by an annealing process. Furthermore, a smooth tunnel barrier layer 17 and free layer 18 can be formed that will lead to improved magnetic properties including a lower Hin value which indicates a smaller interlayer coupling field between the pinned layer and free layer.

In the exemplary embodiment, the composite seed layer 14 is comprised of a lower metal layer 11, a middle layer 12, and an upper metal or alloy layer 13. Preferably, the lower layer 11 is made of Ta with a thickness of about 5 to 100 Angstroms, the middle layer 12 is comprised of Hf having a thickness of about 5 to 100 Angstroms, and the upper layer 13 is NiFe with a thickness in the range of 10 to 100 Angstroms with a Ni content of between 30 and 100 atomic %, and more preferably above 80 atomic %. Each of the layers 11-13 promotes a <111> crystal growth in overlying layers. All of the layers in the composite seed layer 14 and overlying MTJ layers may be laid down by a sputter deposition system. For instance, the MTJ stack of layers may be formed in an Anelva C-7100 thin film sputtering system or the like which typically includes three physical vapor deposition (PVD) chambers each having 5 targets, an oxidation chamber, and a sputter etching chamber. At least one of the PVD chambers is capable of co-sputtering. Typically, the sputter deposition process involves an argon sputter gas and the targets are made of metal or alloys to be deposited on a substrate. All of the MTJ layers may be formed after a single pump down of the sputter system to enhance throughput.

In an alternative embodiment, the lower layer 11 may be made of Zr, Cr, or another metal or alloy that promotes a <111> crystal structure in overlying MTJ layers. Furthermore, Hf in the middle layer 12 may be replaced by a material such as Zr, HfZr, HfCr, Cr, or other metals and alloys that have a lattice parameter and crystal structure that promote a <111> crystal structure in overlying layers and have good oxygen gettering capability. Although not bound by any theory, it is believed by the inventors that the middle layer 12 promotes a distinct boundary between the upper layer 13 and AFM layer 15 by gettering oxygen from the upper layer 13. Moreover, the upper layer 13 becomes less oxygen contaminated and has a higher conductivity thereby increasing the dR/R ratio of the MTJ. Hafnium has a larger oxidation potential (lower electronegativity) than Ni, Fe, and Co and therefore is very effective in gettering oxygen from an upper layer 13 made of NiFe or CoFe, for example. Thus, it is especially advantageous that the middle layer 12 be comprised of an element that has an electronegativity less than that of Ni, Fe, and Co. Electronegativity values based on a Pauling scale are provided at the website http://en.wikipedia.org/wiki/Periodic table. Optionally, a ternary alloy comprised of Ni, Fe, and a third element such as Cr, Co, or Cu may be employed as the upper layer 13. The present invention also encompasses an embodiment wherein the upper layer 13 is made of a face centered cubic (FCC) alloy such as CoFe or a metal such as Cu.

The AFM layer 15 is preferably made of IrMn having a thickness from about 50 to 100 Angstroms although MnPt with a thickness of about 80 to 200 Angstroms is also acceptable. Optionally, the AFM layer 15 may be made of NiMn, OsMn, RuMn, RhMn, PdMn, RuRhMn, or MnPtPd or the like. In the exemplary embodiment, the AFM layer is magnetically aligned along the y-axis. An external magnetic field may be applied during the deposition of an MTJ layer such as an AFM layer or a ferromagnetic (FM) layer to influence a magnetization along a certain axis.

The SyAP pinned layer 16 preferably has an AP2/Ru/AP1 configuration. The AP2 layer is formed on the AFM layer 15 and is preferably comprised of CoFe with a thickness of about 15 to 30 Angstroms. The magnetic moment of the AP1 layer (not shown) is pinned in a direction anti-parallel to the magnetic moment of the AP1 layer. The slight difference in thickness between the AP1 and AP1 layers produces a small net magnetic moment for the SyAP pinned layer 16. Exchange coupling between the AP2 layer and the AP1 layer is facilitated by a coupling layer that is preferably comprised of Ru with a thickness of about 7.5 Angstroms. In one embodiment, the AP1 layer is comprised of CoFe with a composition of about 25 to 50 atomic % Fe and a thickness of 10 to 25 Angstroms. Optionally, the AP1 layer may be a composite layer that includes a thin nano-oxide layer (NOL) such as FeTaO or CoFeO sandwiched between CoFe layers. The nano-oxide layer is employed to increase smoothness of the AP1 layer. Above the SyAP pinned layer 16 is formed a thin tunnel barrier layer 17 which is an oxidized metal layer that may be represented as AlOx, MgO, or TiOx. In one embodiment, a 5 to 6 Angstrom thick Al layer is deposited on the SyAP pinned layer 16 and is subsequently oxidized by an in-situ radical oxidation (ROX) that involves a plasma oxidation process in which a grid-like cap is placed between an upper ionizing electrode and a substrate surface (Al layer) in an oxidation chamber of the sputter deposition tool that is used to deposit the Al layer. The resulting $AlO_x$ layer has a thickness of about 7 to 11 Angstroms and has excellent smoothness and uniformity because of the smooth and densely packed composite seed layer 14 and a <111> crystal structure in underlying AFM layer 15 and SyAP pinned layer 16. Alternatively, a Mg layer about 8 Angstroms thick may be deposited on the SyAP pinned layer 16. Then a ROX or natural oxidation (NOX) process is performed to oxidize the Mg layer. Subsequently, a second Mg layer about 4 Angstroms thick is deposited on the oxidized Mg layer to result in a MgO tunnel barrier layer 17.

The free layer 18 formed on the tunnel barrier layer 17 may be a composite CoFe/NiFe layer in which a CoFe layer with a thickness of about 5 to 15 Angstroms is formed on the tunnel barrier layer 17 and a NiFe layer having a thickness between about 20 and 40 Angstroms is disposed on the CoFe layer. In one embodiment, the CoFe layer has a similar composition to the CoFe layers in the previously described AP1 layer. The present invention also encompasses an embodiment in which a nano-oxide layer is formed between the CoFe and NiFe layers in the free layer 18. Alternatively, when the AP1 layer in the SyAP pinned layer 16 is CoFeB and the tunnel barrier layer 17 is MgO, then the free layer 18 may also be comprised of CoFeB. A moderate spin polarization material is preferably selected as the free layer to help minimize the magnetostriction ($\lambda_S$) in the MTJ element. In the example of the composite CoFe/NiFe free layer, a NiFe layer in which the Fe content is between about 8 atomic % and 21 atomic % may be advantageously employed to minimize magnetostriction. The free layer 18 is magnetically aligned along the y-axis (pinned layer direction). When the MTJ is elliptically shaped as seen in a top view (not shown), the easy axis of the MTJ element is along the long axis.

In one embodiment, there is a capping layer 19 comprised of Ru, Ta, or a composite thereof formed on the free layer 18. Typically, the capping layer 19 has a thickness from about 60 to 250 Angstroms. Optionally, other capping layer materials may be used. When the capping layer 19 is a composite layer comprised of an upper or "outer" layer, the outer layer is preferably a material such as Ru that is resistant to oxidation, provides good electrical contact with a subsequently deposited top shield (not shown), and is a low resistance conductor. Moreover, an outer capping layer such as Ru is selected to serve as an efficient stopping layer during a chemical mechanical polish (CMP) process that may be employed during a later stage of the TMR fabrication sequence. When the capping layer 19 is a single layer, then the requirements that relate to the outer layer in a composite capping layer also apply to the single layer configuration.

Figure 2:
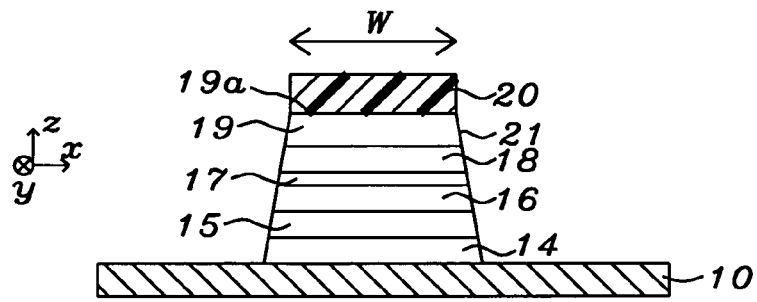
FIG. 2 is a cross-sectional view of a partially completed TMR read head in which an MTJ element is formed on a bottom shield according to one embodiment of the present invention.

Referring to FIG. 2, an MTJ element comprised of layers 14-19 and having sidewalls 21 and a top surface 19a may be fabricated by coating and patterning a photoresist layer 20 that has a width w on the capping layer 19. Next, the photoresist layer 20 is employed as an etch mask during an ion beam etch (IBE) or reactive ion etch (RIE) sequence that removes regions of the MTJ stack of layers 14-19 which are not protected by the etch mask. As a result, an MTJ element is formed that typically has sloped sidewalls in which the capping layer 19 has a width w and the seed layer 14 has a width greater than w. Once the etch sequence is complete, the photoresist layer 20 may be removed by a conventional stripping process known to those skilled in the art.

Figure 3:
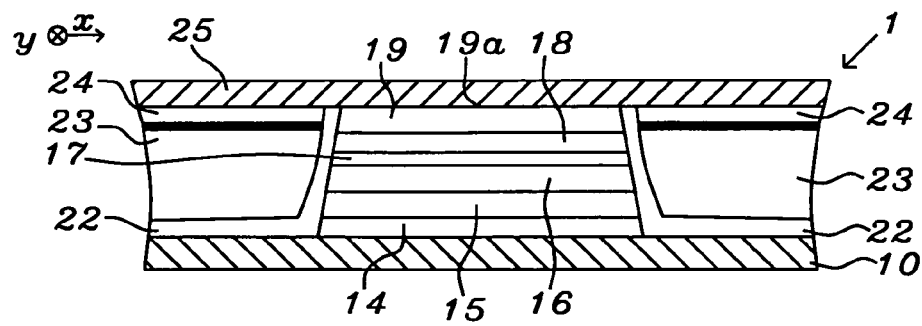
FIG. 3 is a cross-sectional view of a TMR read head having a MTJ element according to the present invention-in which the MTJ element is enclosed between a bottom shield, top shield, and a hard bias structure on adjacent sides.

Referring to FIG. 3, a first dielectric layer 22 made of $Al_2O_3$ or the like with a thickness of about 100 to 150 Angstroms is deposited on the bottom shield 10 and along the sidewalls 21 of the MTJ element by a chemical vapor deposition (CVD) or physical vapor deposition (PVD) method. Next, a hard bias layer 23 that may have a TiW/CoCrPt/Ta configuration, for example, is deposited on the first dielectric layer 22. Then a second dielectric layer 24 is deposited on the first dielectric layer 22 and on the hard bias layer 23. In one embodiment, the hard bias layer 23 has a thickness of about 200 to 400 Angstroms and the second dielectric layer 24 has a thickness between about 150 and 250 Angstroms. A planarization step such as a CMP process may be employed to make the second dielectric layer 24 coplanar with the top surface 19a of the MTJ element. An upper shield 25 is disposed on the top surface 19a of the MTJ element and on the second dielectric layer 24. The upper shield 25 may be a composite layer such as Ta/NiFe as appreciated by those skilled in the art.

Figure 4:
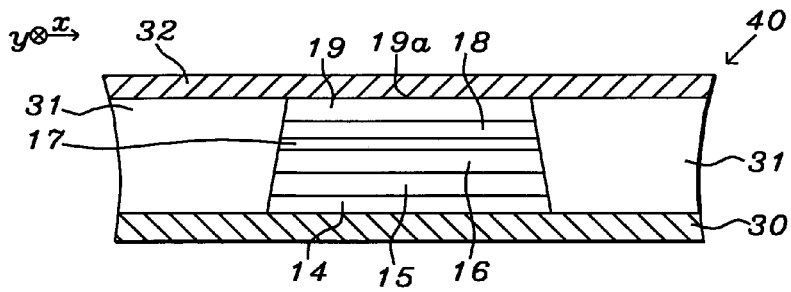
FIG. 4 is a cross-sectional view of a MRAM in which a MTJ element having a composite seed layer is formed according to an embodiment of the present invention.

In a second embodiment depicted in FIG. 4, an MRAM structure 40 comprised of a MTJ having a composite seed layer as described in the first embodiment is disclosed. An MTJ element comprised of layers 14-19 is disposed on a substrate that has a bottom conductor 30 formed therein. Typically, the bottom conductor 30 is formed within an insulation layer and above a first conductive line called a word line (not shown) that is used to conduct current in a +y or −y direction. Optionally, the first conductive line may be called a digit line, data line, row line, or column line as appreciated by those skilled in the art. The bottom conductor layer 30 may have a seed layer/conductive layer/capping layer configuration, for example, but is shown as a single layer in this drawing.

It should be understood that the MRAM structure 40 is part of an MRAM array in which multiple parallel word lines are formed in a first conductive layer and multiple top conductor electrodes such as parallel bit lines are formed in a second conductive layer above an array of MTJs. Alternatively, the first conductive layer may be parallel bit lines while the second conductive layer is parallel word lines. The word lines and bit lines are aligned orthogonal to each other and a bottom conductor layer may be used to connect each MTJ element with a transistor in the substrate. In the exemplary embodiment, an MTJ element is formed between a bottom conductor layer and bit line at each location where a bit line crosses over a word line.

The bottom conductor 30 may be a sectioned line, for example, that has a rectangular shape in the x,y plane and a thickness in the z direction. Alternatively, the bottom conductor 30 may be a bit line that is aligned orthogonally to an underlying word line (not shown) and to a subsequently formed second word line above the MTJ. In one embodiment, the bottom conductor 30 may have a NiCr/Ru/Ta seed layer/conductive layer/capping layer configuration, for example.

An MTJ stack of layers 14-19 is formed on the bottom conductor 30 using an Anelva C-7100 thin film sputtering system or the like as described in the previous embodiment. In this case, the tunnel barrier layer 17 may be slightly thicker than in the TMR embodiment in order to adjust the RA value to a greater magnitude. Moreover, the free layer 18 is preferably made of a moderate spin polarization material as understood by those skilled in the art. A high spin polarization material is defined as a CoFe alloy in which the atomic % of Fe is >20%, a NiFe alloy in which the atomic % of Fe is >40%, or a $[(CoFe)_m B_n]$ alloy with $\geq 25$ atomic % Fe in the CoFe composition.

The present invention also encompasses an annealing step after all of the MTJ layers have been deposited. For example, in the exemplary embodiment, the MTJ stack of layers having an AlOx tunnel barrier layer may be annealed by applying a magnetic field of 10K Oe in magnitude along the y-axis for 5 hours at a temperature above 250° C. and preferably about 280° C. Optionally, when the tunnel barrier is comprised of MgO, the annealing process is typically in the range of 250° C. to 350° C.

After all of the MTJ layers have been deposited and annealing is completed, an MTJ element with sidewalls and a top surface 19a is fabricated by first coating and patterning a photoresist layer (not shown) that has a certain width on the capping layer 19. The MTJ element is formed by an etching process as described in the first embodiment. After the MTJ element is formed by patterning the MTJ stack of layers 14-19, the photoresist layer may be stripped. Then an insulation layer 31 is formed on the bottom electrode 30 and adjacent to the MTJ element by a conventional method that may involve depositing an insulation material with a low dielectric constant and then planarizing the insulation layer 31 to be coplanar with the top surface 19a of the MTJ.

The next step in fabricating the MRAM structure 40 is to form a top conductor (bit line) 32 on the third insulation layer 31 an on the top surface 19a of the MTJ element. The bit line 32 is aligned in a direction orthogonal to that of the word line (not shown) and may be comprised of more than one layer. For instance, a top conductor layer such as Cu, Au, or Al may be enclosed on the sides and bottom by a diffusion barrier layer as appreciated by those skilled in the art. Optionally, there may be a cladding layer on one or more sides of the bit line 32. In the exemplary embodiment, the bit line 32 is used to carry current in a +x or −x direction and the word line has a lengthwise direction along the y-axis. When the bottom conductor 30 is a sectioned line with a rectangular shape, a longer side may be formed in the y direction and the shorter side may be formed in the x direction. According to a well known right hand rule, a current flowing through the bit line 32 generates a first magnetic field in the easy axis direction of the free layer while a current in the word line produces a second magnetic field in the hard axis direction during a write operation. The direction of flow and magnitude of the bit line current and word line current is changed to align the magnetization of the free layer 18 in a particular direction.

The advantages of the second embodiment are the same as for the first embodiment in that the composite seed layer 14 enables a smoother growth in overlying layers 15-19 that results in a larger Hex/Hc ratio which is inversely proportional to the amount of so-called "popcorn noise" in the device. In other words, as Hex/Hc increases, the popcorn noise decreases thereby improving device performance. Furthermore, less pin dispersion is observed in the MTJ element according to the present invention compared to the prior art. A reduction in pin dispersion is well known to produce a more stable device.

COMPARATIVE EXAMPLE 1

An experiment was conducted to demonstrate the performance of an MTJ element in a TMR configuration in which a seed layer, IrMn AFM layer, SyAP pinned layer, tunnel barrier layer, free layer, and capping layer were sequentially formed on a substrate made of AlTiC. In this example, the IrMn AFM layer has a thickness of 70 Angstroms, the SyAP pinned layer has a CoFe23/Ru7.5/CoFe21 configuration, the tunnel barrier is made of MgO (Mg6/NOX/Mg3), the free layer is a 40 Angstrom thick composite CoFe/NiFe layer, and the capping layer is Ta50/Ru30. The results are compared with those from a conventional TMR structure that has the same AFM layer, pinned layer, tunnel barrier, free layer, and capping layer configuration but with a composite seed layer having a 20 Angstrom thick lower Ta layer and a 20 Angstrom thick upper layer made of Ru rather than a Ta20/Hf20 seed layer. The results in Table 1 indicate that a Ta/Hf seed layer configuration provides an amorphous like template for IrMn growth and thereby results in a smoother tunnel barrier layer and smaller Hin. The interlayer coupling (Hin) between the SyAP pinned layer and free layer was reduced to about ⅓ of the original value obtained with a Ta/Ru seed layer.

TABLE 1

Hin Values for Seed
Layer/IrMn/SyAP/MgO/CoFe/NiFe/Ta/Ru TMR Stacks

| Sample | Seed layer | Hin (Oe) |
|---|---|---|
| 1 (Ref) | 20 Ta/20 Ru | 31.68 |
| 2 | 20 Ta/20 Hf | 12.98 |

COMPARATIVE EXAMPLE 2

Subsequently, a second experiment was performed to compare the exchange coupling field (Hex) between the AFM layer and SyAP pinned layer. In this case, the TMR film structure was comprised of a seed layer/IrMn AFM layer/AP1 portion of pinned layer/capping layer. As shown in Table 2, Hex and Hex/Hc between the IrMn AFM layer and AP1 layer are degraded in sample 2 compared with a standard Ta/Ru seed layer configuration in reference sample 1. Therefore, a modification of the Ta/Hf seed layer design is necessary to improve the Hex value while maintaining a low Hin as in Table 1.

TABLE 2

Magnetic values for Seed Layer/IrMn70/CoFe23/Ta/Ru TMR Stacks

| Sample | Seed Layer | Hex (Oe) | Hc (Oe) | Hex/Hc |
|---|---|---|---|---|
| 1 (Ref) | 20 Ta/20 Ru | 1865 | 246 | 7.58 |
| 2 | 20 Ta/20 Hf | 350 | 130 | 2.69 |

COMPARATIVE EXAMPLE 3

It is well known that FCC alloys such as NiFe and CoFe promote IrMn growth and growth in other AFM layers such as MnPt thereby enhancing the exchange coupling property between the AFM layer and adjacent pinned layer. In order to improve the Hex and Hc between the IrMn and an adjacent AP1 portion of the pinned layer in the TMR configuration represented in Table 2, a 20 Angstrom thick NiFe layer was added as an upper layer in the composite seed layer structure (sample 2) described in the first two examples. Table 3 shows the interlayer coupling (Hin) that results from a Ta/Hf/NiFe seed layer configuration is reduced about 13% compared to the reference Ta/Ru seed layer. The actual Hin value changed from about 31.68 Oe for the reference sample 1 to 27.6 Oe for sample 2 which suggests a TMR sensor with a Ta/Hf/NiFe seed layer will have a smoother surface than the reference Ta/Ru seed layer. The Ta and Hf layer thicknesses were reduced to 10 Angstroms in this example in order to keep the overall thickness of the seed layer equivalent to that of the reference sample.

TABLE 3

Hin Values for Seed Layer/IrMn/SyAP/MgO/NiFe/Ru TMR Stacks

| Sample | Seed layer | Hin (Oe) |
|---|---|---|
| 1 (Ref) | 20 Ta/20 Ru | 31.68 |
| 2 | 10 Ta/10 Hf/20 NiFe | 27.66 |

COMPARATIVE EXAMPLE 4

The Hex and Hc values were determined for the Ta/Hf/NiFe seed layer described in the previous example. The film structure for these measurements is the same as in Comparative Example 2 except for the modified seed layer structure in sample 2. Note that the Hex/Hc ratio of the Ta/Hf/NiFe composite seed layer of the present invention is nearly twice as large as that for the Ta/Ru reference sample in Table 4. The improvement in the Hex/Hc ratio is believed to be primarily a result of reducing Hc by growing Ta/Hf/NiFe underneath the IrMn AFM layer and improving the smoothness of MTJ layers above the seed layer. Furthermore, it is believed that inserting a NiFe layer above the Hf layer in the seed layer configuration leads to the formation of a NiFeHf layer that is non-magnetic and does not interfere with the magnetic moment of the AFM or pinned layers. The NiFeHf layer may be in the form of an intermediate layer between a middle layer 12 made of Hf and an upper layer 13 comprised of NiFe, for example, and results from Hf diffusing into the NiFe layer and then reacting to give a NiFeHf alloy.

TABLE 4

Magnetic values for Seed Layer/IrMn70/CoFe23/Ru TMR Stacks

| Sample | Seed Layer | Hex (Oe) | Hc (Oe) | Hex/Hc |
|---|---|---|---|---|
| 1 (Ref) | 20 Ta/20 Ru | 1865 | 246 | 7.58 |
| 2 | 10 Ta/10 Hf/20 NiFe | 1891 | 135 | 14.00 |

Figure 5:
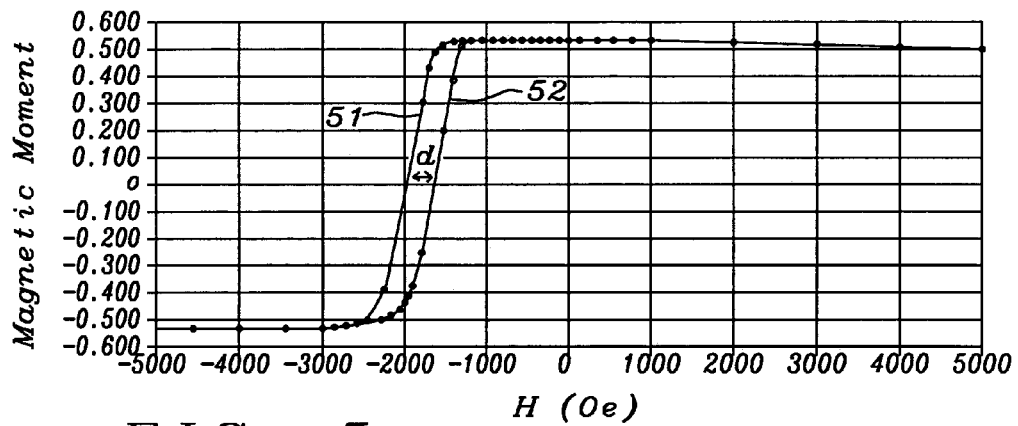
FIG. 5 is a plot that shows magnetic field along the x-axis and magnetic moment along the y-axis for a stack comprised of a Ta/Ru seed layer, IrMn AFM layer, CoFe pinned layer, and Ru/Ta/Ru capping layer.
Figure 6:
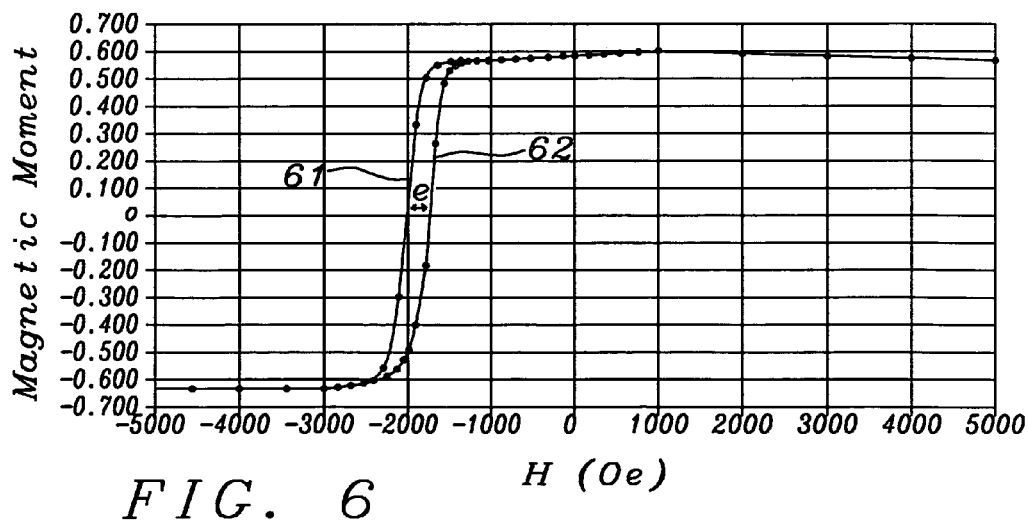
FIG. 6 is a plot similar to that in FIG. 5 except the Ta/Ru seed layer is replaced by a Ta/Hf/NiFe seed layer of the present invention.

Referring to FIG. 5, a VSM M-H loop comparison between the Ta/Hf/NiFe composite seed layer (sample 2 in Comparative Example 4) of the present invention and the reference Ta/Ru seed layer (sample 1 in Comparative Example 4) is illustrated. With the insertion of NiFe as the upper layer in the Ta/Hf/NiFe seed layer configuration, less pin layer dispersion is observed. Note that the difference in pin dispersion is determined by measuring the distance d along the x-axis between curves 51 and 52 and comparing this value to the distance e along the x-axis between curves 61 and 62 in FIG. 6. Pin dispersion is less if FIG. 6 than in FIG. 5 since e<d. The same magnetic moment (i.e. 0 Oe) is used in both FIG. 5 and FIG. 6 for the measurement. It is also important to observe that there is no double loop formation found in FIG. 6 for a MTJ comprised of the composite seed layer of the present invention which suggests the Ta/Hf/NiFe seed layer is non-magnetic and should not affect magnetic properties in the overlying AFM layer and SyAP pinned layers.

While this invention has been particularly shown and described with reference to, the preferred embodiment thereof, it will be understood by those skilled in the art that various changes in form and details may be made without departing from the spirit and scope of this invention.

We claim:

1. A MTJ element in a magnetic device, comprising a seed layer formed on a substrate wherein said seed layer is comprised of a lower metal layer having a first composition, a middle layer with a second composition and made of a metal or alloy having an electronegativity less than Ni, Fe, and Co, and an upper metal or alloy layer having a third composition wherein the first, second, and third compositions differ from each other and the lower metal layer, middle layer, and upper metal layer in said seed layer all promote a <111> crystal growth in overlying layers in the MTJ element.

2. The MTJ element of claim 1 wherein the substrate is a bottom electrode in a MRAM device or a bottom shield in a TMR read head.

3. The MTJ element of claim 1 wherein the lower metal layer is comprised of Ta, Zr, or Cr.

4. The MTJ element of claim 3 wherein the lower metal layer has a thickness in the range of about 5 to 100 Angstroms.

5. The MTJ element of claim 1 wherein the middle layer is made of Hf, Zr, Cr, HfZr, HfCr, or alloys thereof.

6. The MTJ element of claim 5 wherein said middle layer has a thickness from about 5 to 100 Angstroms.

7. The MTJ element of claim 1 wherein said upper layer is comprised of NiFe wherein the Ni content is from about 30 to 100 atomic % and said upper layer has a thickness between about 10 and 100 Angstroms.

8. The MTJ element of claim 1 wherein said upper layer is comprised of NiFeX wherein X is Cr, Co, or Cu.

9. The MTJ element of claim 1 wherein the upper layer has a face centered cubic (FCC) structure and is CoFe or Cu.

10. The MTJ element of claim 1 wherein the seed layer is comprised of a lower Ta layer, a middle Hf layer, and an upper NiFe layer, and the MTJ is further comprised of an IrMn AFM layer, a pinned layer, a tunnel barrier layer, a free layer, and a capping layer that are sequentially formed on the seed layer.

11. A method of forming a MTJ element in a magnetic device, comprising:

(a) forming a seed layer on a substrate wherein said seed layer is comprised of a lower metal layer having a first composition, a middle layer with a second composition and made of a metal or alloy having an electronegativity less than Ni, Fe, and Co, and an upper metal or alloy layer having a third composition wherein the first, second, and third compositions differ from each other and the lower metal layer, middle layer, and upper metal layer in said seed layer all promote a <111> crystal growth in overlying layers in the MTJ element; and (b) forming a stack of MTJ layers on said seed layer.

12. The method of claim 11 wherein said seed layer and all layers in said stack of MTJ layers are formed in a sputter deposition system that is comprised of sputter deposition chambers, at least one oxidation chamber, and at least one etching chamber.

13. The method of claim 11 wherein the substrate is a bottom electrode in a MRAM device or a bottom shield in a TMR read head.

14. The method of claim 11 wherein the lower layer is comprised of Ta, Zr, or Cr and has a thickness between about 5 and 100 Angstroms.

15. The method of claim 11 wherein the middle layer is made of Hf, Zr, Cr, HfZr, HfCr, or alloys thereof.

16. The method of claim 11 wherein said middle layer has a thickness between about 5 and 100 Angstroms.

17. The method of claim 11 wherein the upper layer is comprised of NiFe wherein the Ni content is from about 30 to 100 atomic % and said upper layer has a thickness between about 10 and 100 Angstroms.

18. The method of claim 11 wherein said upper layer is comprised of NiFeX wherein X is Cr, Co, or Cu.

19. The method of claim 11 wherein the upper layer has a face centered cubic (FCC) structure and is CoFe or Cu.

20. The method of claim 11 wherein the seed layer is comprised of a lower Ta layer, a middle Hf layer, and an upper NiFe layer, and the MTJ is further comprised of an IrMn AFM layer, a pinned layer, a tunnel barrier layer, a free layer, and a capping layer that are sequentially formed on the seed layer.

* * * * *